United States Patent [19]
Iwabuchi

[11] 3,978,372
[45] Aug. 31, 1976

[54] VERTICAL DEFLECTION OUTPUT CIRCUIT

[75] Inventor: Shunji Iwabuchi, Yokohama, Japan

[73] Assignee: Hitachi, Ltd., Japan

[22] Filed: Dec. 2, 1974

[21] Appl. No.: 529,008

[30] Foreign Application Priority Data
Dec. 3, 1973 Japan.......................... 48-137680[U]

[52] U.S. Cl................................. 315/397; 315/399
[51] Int. Cl.² ..................... H01J 29/70; H01J 29/76
[58] Field of Search ........... 315/395, 396, 397, 399, 315/389, 403

[56] References Cited
UNITED STATES PATENTS
| | | | |
|---|---|---|---|
| 3,303,380 | 2/1967 | Kozikowski | 315/397 |
| 3,727,096 | 4/1973 | Wilcox | 315/395 |
| 3,786,303 | 1/1974 | Hilburn | 315/397 |

Primary Examiner—Maynard R. Wilbur
Assistant Examiner—T. M. Blum
Attorney, Agent, or Firm—Craig & Antonelli

[57] ABSTRACT

In a vertical deflection output circuit comprising two transistors connected in push-pull configuration, the junction point of the two transistors is connected through a series circuit of a capacitor and a vertical deflection coil, with a first power source and also connected through a switch, which is turned on during the vertical retrace period, with a second power source whose voltage is higher than that of the first power source, and one end of a bootstrap capacitor is connected with the junction point while the other end of the bootstrap capacitor is connected with the base of one of the two transistors and also connected through a resistor with the second power source, whereby the bootstrap capacitor is prevented from being exposed to a voltage whose polarity is opposite to that of the voltage developed across the bootstrap capacitor due to the charging thereof.

5 Claims, 3 Drawing Figures

VERTICAL DEFLECTION OUTPUT CIRCUIT

The present invention relates to a vertical deflection output circuit of a television receiver having a single-ended push-pull circuit (hereafter referred to, for brevity, as SEPP circuit).

The present invention and its advantages will be described in detail with reference to the accompanying drawings, in which.

In a vertical deflection output circuit having an SEPP circuit, a source voltage is changed over in amplitude between during the vertical scanning and retrace periods so as to efficiently operate the circuit.

Figure 1:
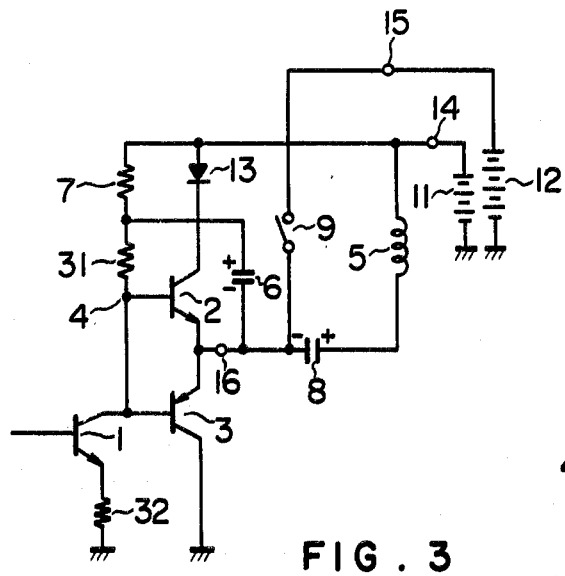
FIG. 1 shows a previously proposed vertical deflection output circuit using two dc power sources having different voltages.

FIG. 1 shows an example of a previously proposed vertical deflection output circuit of the above-mentioned type.

The earlier circuit has been invented by IWABUCHI et al and disclosed in U.S. Pat. application Ser. No. 474,025 specification filed on May 28, 1974. Therefore, the circuit shown in FIG. 1 will be only roughly explained below.

In FIG. 1, reference numeral 1 indicates a vertical deflection exciting transistor; 2 and 3 output transistors having different polarities and constituting a push-pull configuration; 4 the junction point of the bases of the transistors 2 and 3 and the collector of the transistor 1; 5 a vertical deflection coil; 6 a bootstrap capacitor; 7, 31 and 32 resistors; 8 a capacitor; 9 an electronic switch which is turned on during the vertical retrace period but off during the vertical scanning period; 16 the junction point of the emitters of the output transistors 2 and 3; 11 a first dc power source; 14 the positive terminal of the first dc power source 11; 12 a second dc power source whose voltage is higher than that of the first dc power source; 15 the positive terminal of the second dc power source; and 13 a diode. The emitter of the vertical deflection excuting transistor 1 is grounded through the resistor 32 and a voltage having a trapezoidal waveform is applied to the base thereof. The junction point 4 is connected through series-connected resistors 31 and 7 with the positive terminal 14 of the first dc power source 11. The negative terminal of the source 11 is grounded. The collector of the output transistor 3 is grounded while the collector of the output transistor 2 is connected through the diode 13 with the positive terminal 14 of the first dc power source 11. The bootstrap capacitor 6 is connected between the junction point 16 and the junction point of the resistors 7 and 31. The negative terminal of the second dc power source 12 is grounded while the positive terminal 15 thereof is connected through the electronic switch 9 with the junction point 16. The vertical deflection coil 5 and the capacitor 8, connected in series, are inserted between the first dc power source 11 and the junction point 16. In the Figure, this series connection of the vertical deflection coil 5 and the capacitor 8 is inserted between the positive terminal 14 of the first dc power source 11 and the junction point 16, but it may be inserted between the junction point 16 and the earth or the negative terminal of the first dc power source 11.

Figure 2:
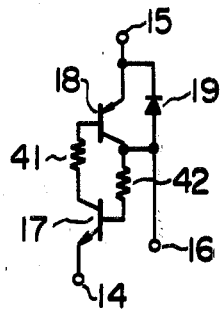
FIG. 2 shows a concrete circuit of an electronic switch used in the circuit shown in FIG. 1.

FIG. 2 is a concrete example of the circuit of the electronic switch 9 shown in FIG. 1. In FIG. 2, reference numerals 17 and 18 designate transistors, 19 a diode, and 41 and 42 resistors. The emitter of the transistor 17 is connected with the positive terminal 14 of the first dc power source 11 shown in FIG. 1, the base of the transistor 17 is connected through the resistor 42 with the junction point 16, and the collector of the transistor 17 is connected through the resistor 41 with the base of the transistor 18. The collector of the transistor 18 is connected with the junction point 16 and the emitter thereof is connected with the positive terminal 15 of the second dc power source 12. The diode 19 is connected between the terminal 15 and the junction point 16.

A trapezoidal-wave signal is applied to the base of the vertical deflection exciting transistor 1 and the transistors 2 and 3 are rendered alternately conductive during the vertical scanning period so that a saw-tooth deflection current flows through the deflecting coil 5. During the vertical retrace period, the electronic switch 9 is turned on so that the junction point 16 is connected with the second dc power source whose voltage is higher than that of the first dc power source 11, whereby the value of the deflection current flowing through the coil 5 at the termination of deflection is restored to the value at the initiation of deflection in a predetermined time.

Therefore, since the circuit shown in FIG. 1 is driven during the vertical scanning period by the first dc power source 11 whose voltage is lower than that of the second dc power source 12, the vertical deflection circuit shown in FIG. 1 is considered to have an improved power efficiency in comparison with the vertical deflection circuit which is driven by the second dc power source 12 during both the vertical scanning and the vertical retrace periods.

The bootstrap capacitor 6 is so provided as to supply sufficient base current for the transistor 2 at the initiation of the vertical scanning so that sufficient deflection current may flow through the deflection coil 5. When the electronic switch 9 is turned on during the vertical retrace period to apply the voltage of the second dc power source 12, which is higher than that of the first dc power source 11, to the junction point 16, the bootstrap capacitor 6 which has been charged with such a polarity as shown in FIG. 1 during the later part of the vertical scanning period will discharge in accordance with the difference in voltage between the first and the second dc power sources during the vertical retrace period, the voltage difference being opposite in polarity to the voltage across the charged bootstrap capacitor 6. Accordingly, in the earlier vertical deflection circuit shown in FIG. 1, the bootstrap capacitor 6 cannot supply so sufficient current for the transistor 2 that sufficient deflection current may flow through the deflection coil 5 at the initiation of vertical scanning and therefore the upper or lower portion of a picture displayed on the picture tube contracts in the vertical direction, as is one of the drawbacks of the earlier vertical deflection circuit. Since the current amplification factor $h_{fe}$ of the transistor 2 is lowered if the ambient temperature around the transistor 2 falls, the contraction phenomenon grows remarkable as the ambient temperature lowers. If the current amplification factor $h_{fe}$ is kept constant, that is, the ambient temperature around the transistor 2 remains constant, the contraction of the displayed picture due to the discharge during the vertical retrace period can be prevented by increasing the capacitance of the bootstrap capacitor 6. In that case, however, the size of the bootstrap capacitor must be increased and this goes counter to the purpose of reducing the size of a television receiver set.

It is therefore one object of the present invention to provide a new and effective vertical deflection output circuit.

Another object of the present invention is to provide a vertical deflection output circuit which can prevent the contraction of the displayed picture without any special circuit element, even if the ambient temperature around the output transistor is lowered.

An additional object of the present invention is to provide a vertical deflection output circuit in which the capacity of the bootstrap capacitor can be decreased without addition of any special circuit element.

One of the most remarkable features of the present invention is that one end of the bootstrap capacitor is always connected with the second power source whose voltage is higher than that of the first power source while the other end of the capacitor is also connected with the second power source through a switch which is turned on during the vertical retrace period.

According to the present invention, therefore, no voltage whose polarity is opposite to that of the voltage across the bootstrap capacitor charged during the vertical scanning period, is applied to the bootstrap capacitor during the vertical retrace period, and accordingly the discharge of the bootstrap capacitor is not promoted, so that the contraction of the picture is prevented. Other objects, features and advantages of the present invention will be apparent from the following detailed description.

Figure 3:
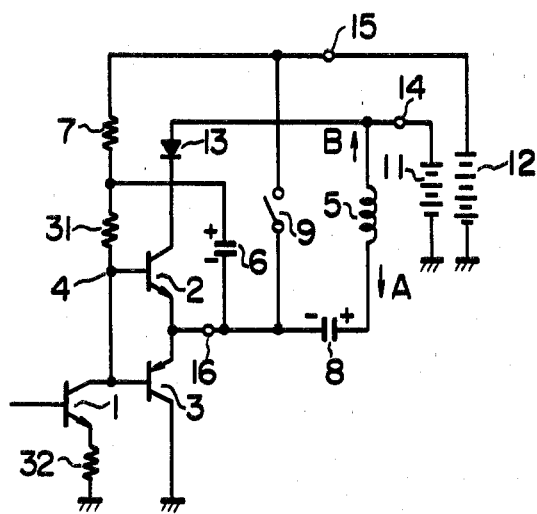
FIG. 3 shows a vertical deflection output circuit as an embodiment of the present invention.

In the figures, the same reference numerals are applied to like parts or circuit elements. The only difference between the circuits shown in FIGS. 1 and 3 is that one end of the resistor 7 which is not connected with the bootstrap capacitor 6 is connected with the second dc power source 12 in the circuit shown in FIG. 3 while it is connected with the first dc power source 11 in the circuit shown in FIG. 1.

Now, the description of the circuit shown in FIG. 3 will be given below. In the figure, the arrows A and B indicate the directions of the deflection current.

As described before, a voltage having a trapezoidal waveform is applied to the base of the vertical deflection exciting transistor 1 so that the transistor 1 is turned off during the vertical retrace period and on during the vertical scanning period. As a result, the output transistors 2 and 3 is alternately rendered conductive during the vertical scanning period by the vertical deflection exciting signal.

During the earlier half of the vertical scanning period, the potential at the junction point 4 is higher than the potential at the emitter of the transistor 2 so that the transistor 2 is turned on to release the electric charges stored in the capacitor 8 through the deflection coil 5, the diode 13 and the output transistor 2. Consequently, current flows in the direction indicated by the arrow B through the deflection coil 5 so that the upper (or lower) half of the phosphor screen of the picture tube is scanned. It is during this earlier half of the vertical scanning period, and especially in the beginning of the period that the bootstrap capacitor 6 plays an important role. Namely, if the bootstrap capacitor 6 is fully charged, the current drawn from the capacitor 6 due to the discharge thereof flows between the base and the emitter, of the transistor 2. Accordingly, the collector current of the transistor 2 especially in the beginning of the vertical scanning increases to produce a desired deflection current. If, on the other hand, the bootstrap capacitor 6 is insufficiently charged, sufficient current cannot flow the base-emitter path of the transistor 2 so that the desired deflection current cannot be obtained in the beginning of the vertical scanning.

As the potential at the junction point 4 falls in accordance with the vertical deflection exciting signal, the deflection current decreases and then the output transistor 2 is turned off to complete the earlier half of the vertical scanning period. In synchronism with the turn-off of the transistor 2, the output transistor 3 is turned on to start the later half of the vertical scanning period. During the later half of the vertical scanning period, the potential at the junction point 4 is lowered below the potential at the junction point 16 in accordance with the vertical deflection exciting signal so that the transistor 2 is turned off while the transistor 3 is turned on. Accordingly, through the deflection coil 5 and the capacitor 8 flows current increasing with time in the direction indicated by the arrow A from the first dc source 11 and the lower (or upper) half of the phosphor screen of the picture tube is scanned. The time-increasing current charges the capacitor 8 at the polarity indicated in the figure. With the transistor 3 turned on, current flows also from the second dc source 12 through the resistor 7, the bootstrap capacitor 6 and the output transistor 3, to charge the capacitor 6 at the polarity indicated in the figure.

When the vertical retrace period is reached, the vertical deflection exciting transistor 1 is turned off and the potential at the junction point 4 rises, and thus the output transistor 3 is turned off. At this time, a voltage higher than that of the first dc power source 11 appears at the junction point 16 due to counter electromotive force induced in the deflection coil 5. Consequently, the transistors 17 and 18 are simultaneously turned on so that the voltage of the second dc power source 12 is applied to the junction point 16. Since the voltage of the second dc power source 12 has the same polarity as the counter electromotive force induced in the deflection coil 5, the current in the direction indicated by the arrow A suddenly vanishes and the current in the direction indicated by the arrow B starts flowing. Since a voltage equal to the difference between those of the first and second dc power sources 11 and 12 is applied to the series circuit of the deflection coil 5 and capacitor 8, the current flowing through the deflection coil 5 in the direction indicated by the arrow B steeply increases up to the value assumed at the beginning of the vertical scanning. The deflection current through the coil 5 is also fed to an amplifying transistor (not shown in FIG. 3) forming a stage just before the vertical deflection exciting transistor 1 and upon reach of the valve of the current flowing in the direction B near to the level assumed at the start of vertical scanning the amplifying transistor is turned on and the output transistor 1 is turned on. Accordingly, the collector current of the transistor 18 is increased and the transistor 18 changes its state from saturated to active, and thus the emitter-collector voltage of the transistor 18 is increased and the potential at the junction point 16 is lowered. When the potential at the junction point 6 is lowered, the base current of the transistor 17 is decreased and the collector current of the transistor 17 or the base current of the transistor 18 is decreased. Therefore, the emitter-collector voltage of the transistor 18 is further increased and thus the potential at the junction point 16 is further lowered, and at last the transistors 17 and 18 are turned off. As a result, the second dc power source 12 connected hitherto with the junction point 16 is disconnected from the point 16 to complete the vertical retrace period and to simultaneously start the vertical scanning period. During the vertical retrace period, the same voltage is applied to both ends of the bootstrap capacitor 6, which voltage is supplied by the second dc power source, and therefore the bootstrap capacitor 6 in the circuit shown in FIG. 3 releases by far less electric charges during the vertical retrace period than in the circuit shown in FIG. 1 in which such an inverse voltage as to promote the discharge of the bootstrap capacitor 6 is applied to the capacitor 6.

The diode 19 is so provided as to prevent the transistors 17 and 18 from breaking down when the voltage at the junction point 16 exceeds the voltage of the second dc power source 12. Namely, the voltage at the junction point 16 is clamped to a voltage equal to that of the source 12. Also, during the vertical retrace period, the potential at the emitter of the transistor 2 is higher than that at the collector thereof so that the transistor 2 functions as a reverse transistor operating such that the emitter and collector are substituted for each other. The diode 13 inserted between the collector of the transistor 2 and the first dc power source 11 serves to prevent the transistor 2 from acting as a reverse transistor. The diode 13 may be inserted between the emitter of the transistor 2 and the junction point 16.

As described above, with the circuit shown in FIG. 3 according to the present invention, the amount of charges stored in the bootstrap capacitor 6 is kept almost the same during the vertical retrace period so that sufficient current can be supplied for the base of the output transistor 2 at the initiation of vertical scanning, whereby sufficient deflection current can be obtained in the beginning of the scanning. Therefore, it is seen that according to the present invention the bootstrap capacitor can be effectively operated.

What I claim is:
1. A vertical deflection output circuit comprising a first series circuit of first and second output transistors with their emitter-collector paths connected in series and with their current conduction directions arranged in the same sense;
   an exciting circuit for turning on said first output transistor during a first half of the vertical scanning period and for turning on said second output transistor during a second half of said vertical scanning period;
   means for supplying the output of said exciting circuit for the bases of said first and second output transistors;
   a first dc power source connected between the ends of said first series circuit;
   a bootstrap capacitor with first and second ends connected respectively with the base and the emitter, of said first output transistor;
   means for connecting a second dc power source whose voltage is higher than that of said first dc power source, between the collector and the emitter of said second output transistor via a switch which is turned on during the vertical retrace period and turned off during the vertical scanning period;
   a second series circuit of a deflecting coil and a capacitor;
   means for connecting said second series circuit between the collector and the emitter, of one of said first and second output transistors; and
   means for connecting said first end of said bootstrap capacitor, with said second dc power source via a resistor.

2. A vertical deflection output circuit as claimed in claim 1, wherein a resistor is inserted between said first end of said bootstrap capacitor and said base of said first output transistor.

3. A vertical deflection output circuit as claimed in claim 2, wherein a diode is connected with one of the collector and emitter of said first output transistor with its current conducting direction arranged in the same sense as that of said current conduction directions of said first output transistors.

4. A vertical deflection output circuit as claimed in claim 1, wherein a diode is interposed in the collector-emitter circuit of said first output transistor, with the same direction of current flow as that of said collector-emitter circuit.

5. In a vertical deflection output circuit comprising
   a first series circuit of a diode and first and second output transistors with their emitter-collector paths connected in series and with their current conduction directions arranged in the same sense;
   an exciting circuit operatively caused to be in the on and off states and connected to supply an output thereof to bases of said first and second output transistors, respectively for turning on said first output transistor during a half of a vertical scanning period and for turning on said second output transistor during a second half of the vertical scanning period;
   a first dc power source connected to supply a first dc voltage across said first series circuit;
   a second series circuit of a deflection coil and a capacitor, one end of said second series circuit being connected to a junction point of said output transistors and the other end of said second series circuit being connected to said first dc power source;
   a second dc power source for generating a second dc voltage higher than said first dc voltage;
   a switch operatively turned on during a vertical retrace period and turned off during the vertical scanning period for supplying the second dc voltage to the junction point of said first and second output transistors when said switch is in its turned on state;
   a third series circuit comprising a first and a second resistor and containing two ends, the first end of said third series circuit being connected to the base of said first output transistor; and
   a bootstrap capacitor with first and second terminals connected with the junction point of said output transistors and a junction point of said first and second resistors, respectively;
   the improvement which comprises means for connecting the second end of said third series circuit to said second dc power source.

* * * * *